United States Patent
Cook et al.

(10) Patent No.: US 6,229,706 B1
(45) Date of Patent: May 8, 2001

(54) REVERSE CANTILEVER SPRING CLIP

(75) Inventors: Randolph H. Cook, Gilford; Daniel Price, Concord; Jack Churchill, Belmont; Victor Strack, Gilmanton; Joseph Jones, Lebanon; Mark Pelillo, Caconia, all of NH (US)

(73) Assignee: Aavid Thermal Products, Inc., Concord, NH (US)

( * ) Notice: Subject to any disclaimer, the term of this patent is extended or adjusted under 35 U.S.C. 154(b) by 0 days.

(21) Appl. No.: 09/299,797

(22) Filed: Apr. 26, 1999

Related U.S. Application Data

(60) Provisional application No. 60/083,224, filed on Apr. 27, 1998.

(51) Int. Cl.[7] .................................................. H05K 7/20
(52) U.S. Cl. ........................... 361/719; 24/458; 248/510; 361/704
(58) Field of Search ........................... 24/453, 458, 472; 267/150, 158, 160; 248/316.7, 505, 510; 165/80.3, 185; 174/16.3; 257/718, 719, 726, 727; 361/695, 697, 704, 710, 717–719

(56) References Cited

U.S. PATENT DOCUMENTS

| | | | |
|---|---|---|---|
| 4,712,159 | 12/1987 | Clemens | 361/386 |
| 4,933,746 | * 6/1990 | King . | |
| 5,241,453 | * 8/1993 | Bright . | |
| 5,430,611 | 7/1995 | Patel et al. | 361/705 |
| 5,570,271 | 10/1996 | Lavochkin | 361/704 |
| 5,586,005 | 12/1996 | Cipolla et al. | 361/719 |
| 5,603,374 | 2/1997 | Wu | 165/80.3 |
| 5,648,890 | 7/1997 | Loo et al. | 361/704 |
| 5,699,229 | 12/1997 | Brownell | 361/719 |
| 5,734,553 | 3/1998 | Hong | 361/697 |
| 5,818,695 | * 10/1998 | Olson . | |
| 5,847,928 | 12/1998 | Hinshaw et al. | 361/704 |
| 5,883,782 | 3/1999 | Thurston et al. | 364/704 |
| 5,990,552 | * 11/1999 | Xie . | |

* cited by examiner

Primary Examiner—Gerald Tolin
(74) Attorney, Agent, or Firm—Cohen, Pontani, Lieberman & Pavane

(57) ABSTRACT

A reverse cantilever spring clip for providing intimate thermal contact between a heat sink and a heat generating electrical component such as an integrated circuit (IC). The spring clip includes a spring member and a retention member. The retention member has one or more legs with a securing member affixed to an outer end of the legs. The legs are configured for engaging a heat sink and a circuit board to which the IC is mounted so that the heat sink is positioned directly over the circuit board. The securing member maintains contact between the IC and heat sink.

13 Claims, 4 Drawing Sheets

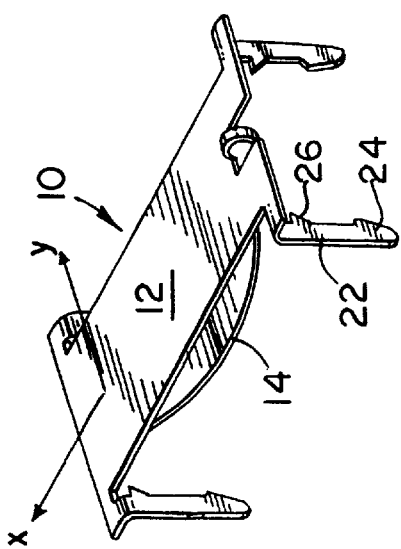
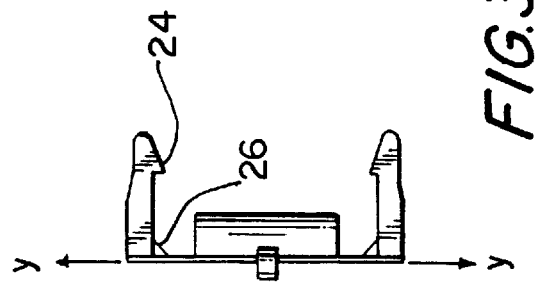
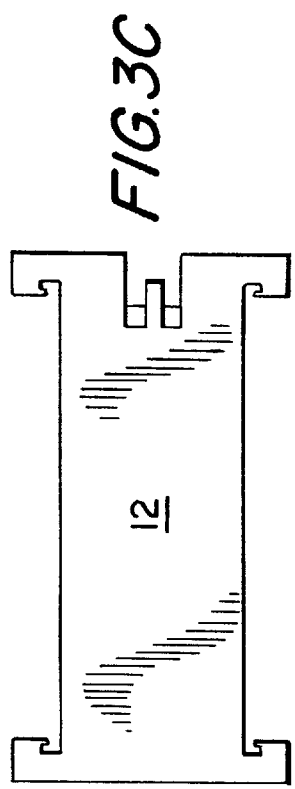
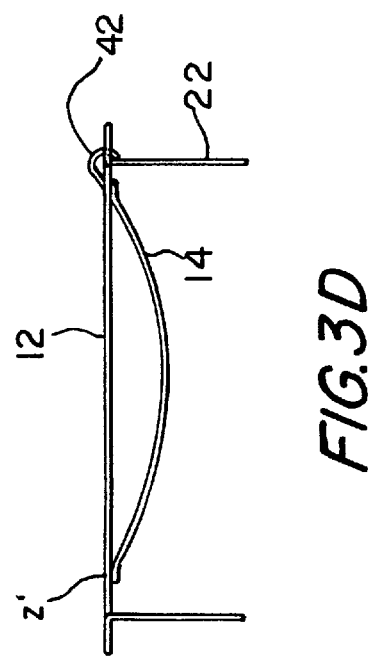
FIG.3A
FIG.3B
FIG.3C
FIG.3D

REVERSE CANTILEVER SPRING CLIP

RELATED APPLICATIONS

This application claims priority from U.S. Provisional Patent Application Serial No. 60/083,224 which was filed on Apr. 27, 1998.

BACKGROUND OF THE INVENTION

1. Field of the Invention

This invention pertains to a clip suitable for providing a compressive force to a series of stacked components. More particularly, the present invention relates to a clip for providing a compressive force to a heat sink and a heat generating component in contact therewith.

2. Description of the Related Art

Heat sinks are widely used in the electronics industry and particularly in connection with electronic components such as integrated circuits ("ICs") and microchips which produce unwanted thermal energy or heat as a byproduct of standard operation. The generated heat adversely affects the operation of such components, and heat sinks are used to absorb, channel away and dissipate the heat produced from such components. To accomplish this task, thermal contact is required between the heat generating component and the heat sink. To maintain such contact, securing devices such as clips are typically used for engaging the heat sink and electronic component and maintaining physical and thermal contact therebetween.

One such clip is described in U.S. Pat. No. 4,712,159 (Clemens) which discloses a heat sink clip assembly having a retention member and a spring member. The clip assembly is employed in an alternating stacked arrangement, wherein the components of the assembly (the retention member and the spring member) are interleaved with the IC and heat sink such that the IC is sandwiched between the retention member and spring member, and the heat sink is placed over the spring member.

The clip assembly of Clemens has several drawbacks. In particular, placement of the heat sink over the spring member requires modification of the spring member to provide physical contact between the heat sink and IC. To accomplish this, the spring member is designed having a center cavity or pass-through which accommodates insertion of a portion of a heat sink base to provide for engagement with the IC. Also, the retention member must be specifically dimensioned for accommodating a particular IC so that the retention member can also engage the spring member when the IC is placed therebetween in an intended manner. Furthermore, the placement of the IC between the spring member and retention member, with the heat sink fitted thereover as described in Clemens renders replacement of a damaged or inoperative IC cumbersome because, the spring member must be detached and separated from the retention member and the heat sink removed to gain access to and replace the damaged IC.

Accordingly, there is a need for a spring clip assembly design which provides thermal and physical contact between a heat sink and IC and which is easy to assembly and disassemble for allowing replacement of damaged or inoperative ICs.

SUMMARY OF THE INVENTION

A clip assembly design is disclosed for clamping stacked components to each other to ensure contact therebetween. For example, when the stacked components consist of a circuit board containing a microprocessor or other integrated circuit (IC) thereon, and a heat sink placed over the IC to remove heat therefrom, continuing contact between the heat sink and the IC must be maintained for efficient heat dissipation. The clip design in accordance with the present invention utilizes a retention member and a spring member, which may be separately or integrally formed, for mounting to a circuit board and heat sink and securing these components to the clip. In a preferred embodiment, the retention member includes a plurality of upstanding legs, each leg having a securing means for engaging a mounting surface of the heat sink. The securing means may comprise, for example, a lip, ledge protrusion or barb located at a far end of one or more legs. The legs are dimensioned for fitting within openings or passageways formed in the circuit board and heat sink.

When a component stack is configured in accordance with the present invention wherein (1) the spring member is positioned on the retention member on the same side as the upstanding legs, (2) the circuit board is positioned over the legs such that the circuit board rests on the spring member, (3) the heat sink is positioned over the legs so that it seats on an IC mounted to the board, and (4) a downward force is applied to the heat sink for compressing the spring, the securing means on the legs will lock against the mounting surface of the heat sink. This will compress the stacked components for maintaining physical and thermal contact between the heat sink and the IC.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein like reference characters denote similar elements throughout the several views:

FIG. 3A is a bottom perspective view of the clip of FIG. 2A shown without tile circuit board and heat sink;

FIG. 3B is a side plan view thereof;

FIG. 3C is a bottom plan view thereof;

FIG. 3D is a cross-sectional view of the device of FIG. 3C;

DETAILED DESCRIPTION OF THE PRESENTLY PREFERRED EMBODIMENTS

Figure 1:
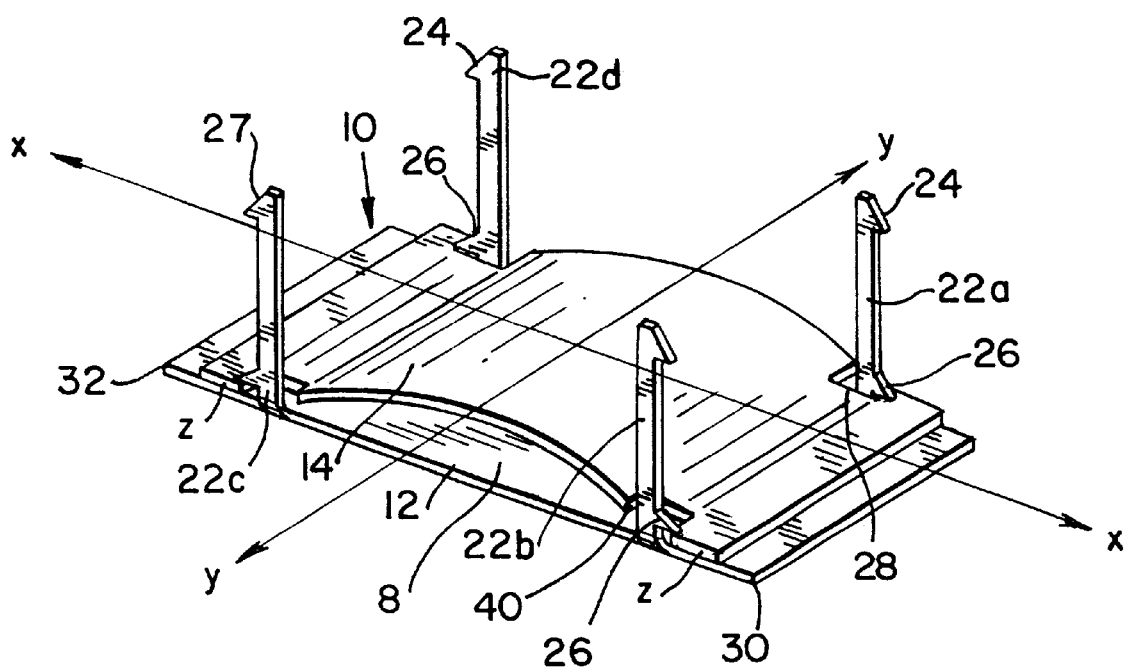
FIG. 1 is a perspective view of a spring clip in accordance with the present invention.
Figure 2B:
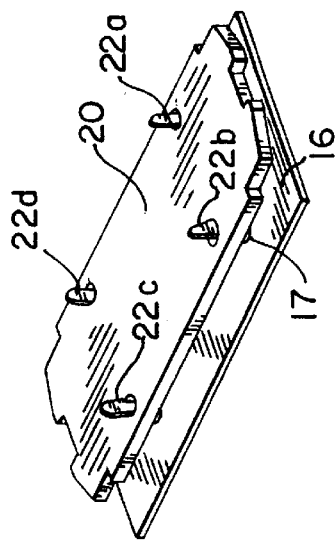
FIG. 2B is a top perspective view of the embodiment of FIG. 2A thereof.
Figure 2C:
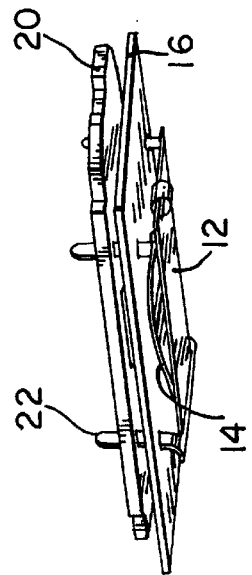
FIG. 2C is a bottom perspective view thereof.
Figure 2A:
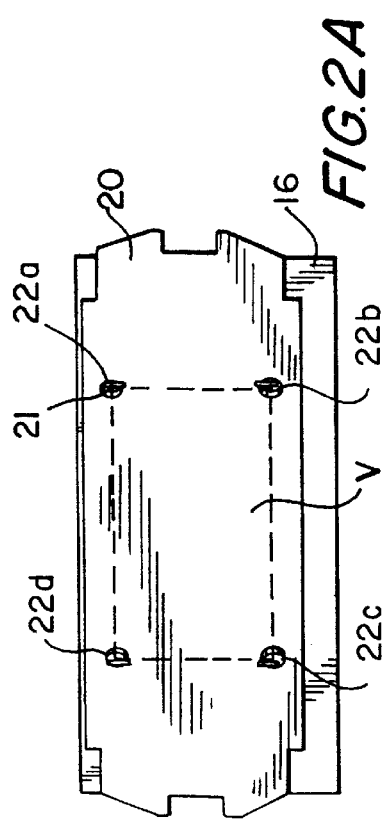
FIG. 2A is a top plan view of another embodiment of the inventive spring clip shown mounted to a circuit board and a heat sink.
Figure 2D:
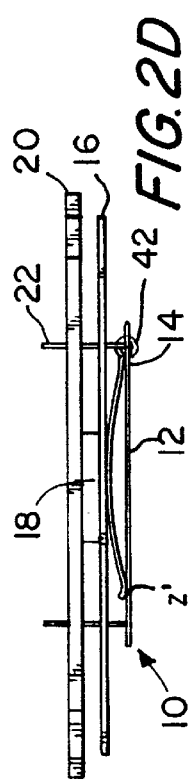
FIG. 2D is a side plan view thereof.
Figure 2E:
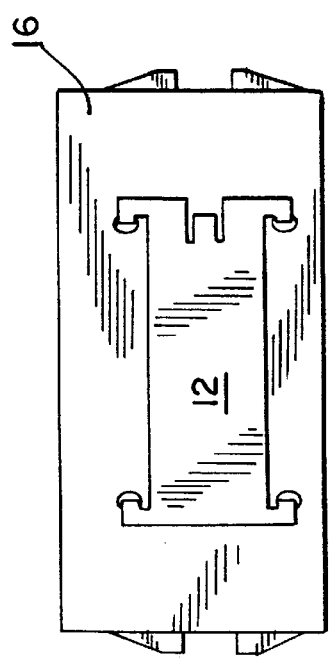
FIG. 2E is a bottom plan view thereof.

With reference now to FIGS. 1 and 2, the inventive clip 10 will now be described. As shown, clip 10 includes a retention member 12 and a spring member 14. The retention and spring members can be separately formed, as shown in FIG. 1, or integrally formed, as shown in FIGS. 2 and 3A–3D. Clip 10 is intended for use in maintaining efficient thermal contact between a heat sink 20 (only the base of which is shown in FIG. 2) and an integrated circuit (IC) 18 mounted on a circuit board 16. Although only the base of the heat sink is shown, it will be appreciated that the heat sink includes known structure such as fins, pins, etc., for dissipating heat generated by the IC.

Retention member 12 has a base 8 and a plurality of upstanding legs 22a, 22b, 22c and 22d, preferably integrally formed with the base. A securing means is attached to one or more of the legs to secure the clip 10 to the engaging regions on the heat sink 20 and the circuit board 16 to maintain contact between the heat sink and IC 18 in the intended manner. The securing means is preferably a retention member, such as a lip, ridge, edge, barb or other surface or protuberance 24 positioned at a far end of one or more of the legs 22 for engaging the heat sink and circuit board such as by contacting surfaces of the heat sink and circuit board. In the preferred embodiment, the retention means is configured as a barb 24 having an angled face 27 which functions to guide the legs through openings or holes 17 formed in the circuit board 16 and through openings or holes 21 formed in the heat sink 20 as described more fully below.

The retention member 12 has outer edges 30, 32 with edge 30 positioned proximate legs 22a, 22b and edge 32 positioned proximate legs 22c, 22d. Retention member 12 is preferably constructed from a flexible material which allows for camber in the legs 22 to provide for easy guidance of the legs through holes 17 and holes 21, even when the holes 17, 21 are not in perfect alignment with each other. The spring member 14 is designed for having a high degree of flexibility in both deflection and force characteristics.

As shown in FIG. 1, spring member 14 has a plurality of cut-outs or grooves 40 dimensioned for seating about the base of legs 22, and is secured to the retention member 12 by a second securing means 26 configured as barbs positioned on legs 22 at the lower ends thereof, such that barbs 26 engage an upper surface of spring member 14 as shown. Once secured, and if desired, the spring member 14 can be removed from the retention member 12 by flexing the retention member in a direction of the spring member and thereby releasing the lower barbs 26. The spring member is convexly shaped relative to the retention member 12 and, in the embodiment of FIG. 1, contacts the retention member at either end thereof as indicated at region "z". For example, one end of spring member 14 contacts retention member 12 between legs 22a, 22b and edge 30, and the other end of spring member 14 contacts the retention member between legs 22c, 22d and edge 32.

The retention member 12 acting on spring 14 applies a compressive force to the heat sink 20 through legs 22 and upper barbs 24. The angled face or guide 27 on the upper barbs 24 facilitate alignment of holes 21 in the heat sink 20 and holes 17 in the circuit board 16 with legs 22 as the heat sink and circuit board are fitted over the upstanding legs 22.

The contact locations between spring member 14 and retention member 12 (shown at "z" in FIG. 1 and at "z" in FIG. 2D) serve to maintain contact between the stacked component configuration (e.g. heat sink and circuit board) in the event a stress force is applied to the clip 10. For example, and with continued reference to FIG. 1, in the event a downward force is exerted on the spring member 14, the force will be conveyed or transferred to the retention member 12 at contact regions z, causing the retention member to flex convexly (i.e. in the direction of spring member 14). When this occurs, the outer ends or tips of legs 22a and 22b move as a pair relative to the outer ends or tips of legs 22c and 22d along the direction of the X-axis promoting engagement between barbs 24 and heat sink 20.

A similar result occurs for the embodiment shown in FIGS. 2 and 3 wherein the retention member 12 and spring member 14 are integrally formed. As shown, in FIG. 2A, the region bounded by legs 22a, 22b, 22c and 22d is identified as "v". Instead of spring member 14 contacting retention member 12 in the region "z" defined from legs 22a, 22b and edge 30 as shown in FIG. 1, spring member 14 contacts the retention member 12 inside region "v". In this embodiment, when a downward force is applied to the spring member 14, the retention member 12 will flex in a concave direction away from the spring member, promoting engagement between upper barbs 24 and the heat sink 20. In this embodiment, to further maintain a clamping force on the heat sink 20 through upper barbs 24, the barbs are oriented in a transverse direction aligned with the Y-axis, i.e. in a right angle orientation relative to barbs 24 of FIG. 1.

As explained above, an integral construction can be used in lieu of the two-piece clip 10 of FIG. 1. Such an embodiment is shown in FIGS. 2 and 3 wherein retention member 12 and spring member 14 are integrally formed by folding spring member 14 over the retention member. Such practice may, however, cause yielding, fracture, separation or material flow at the fold-over joint (shown as 42 in FIGS. 2D and 3D). Such undesired results are alleviated by controlling or adjusting the cross-sectional characteristics of the spring member 14 and retention member 12, such as by varying the width or thickness of the joint 42. In this "one-piece" design, as the spring member 14 and retention member 12 are permanently affixed to each other, second securing means 26 is no longer needed to secure these components to each other. As such, the spring member can be designed without cut-outs or grooves 40.

As an alternative to an integral construction wherein the spring member 14 and retention member 12 are formed from a common material, these members can be formed separately (either from similar or dissimilar materials), and then joined to a flexible hinge or joint which may be made from a similar or different material as either the spring member or retention member, thus resulting in a "hybrid" one-piece clip design.

Figure 4A:
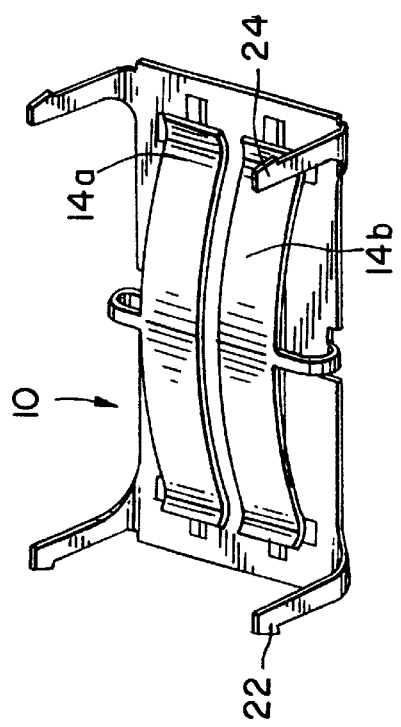
FIG. 4A is a top perspective view of another embodiment of the present invention.
Figure 4B:
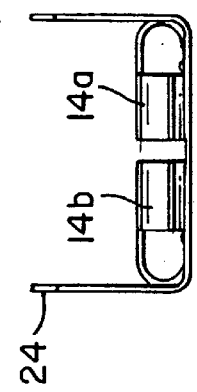
FIG. 4B is a side plan view thereof.
Figure 4C:
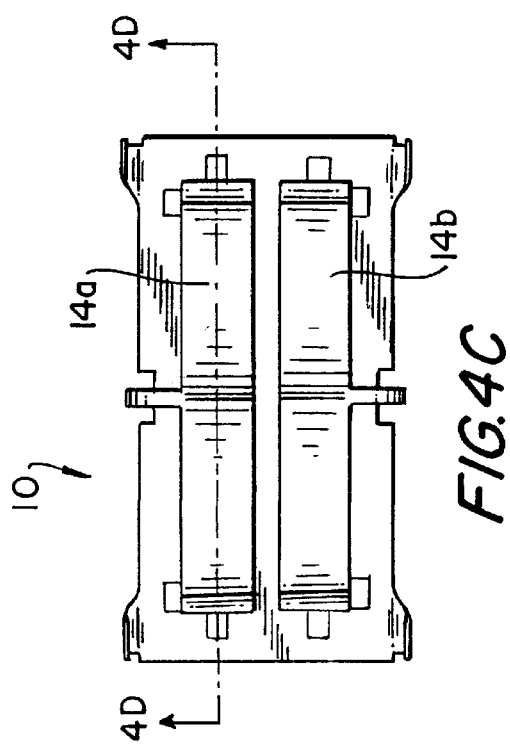
FIG. 4C is a top plan view thereof.
Figure 4D:
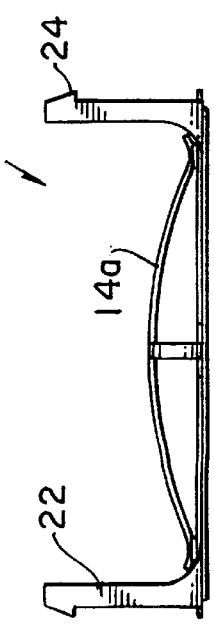
FIG. 4D is a cross-sectional view of the device of FIG. 4C.

The heretofore described clip designs incorporate a single spring member 14. In another embodiment of the invention, shown in FIG. 4, a clip 10 having multiple spring members (shown as 14a and 14b in FIG. 4A) can be constructed. In this embodiment the spring is joined to the retention body at a location approximately at the mid-span point of the spring. However, multiple leaf designs are envisioned with the spring-to-retention body joint located at one end of the spring as well, i.e. at the contact point between the retention member and spring members.

The disclosed clip 10 has several unique aspects. First, the spring member 14 is constructed to have a semi-low spring rate such that a high force is generated through a large spring deflection. Preliminary calculations have shown that a spring rate of 80–100 lbf/in is possible. Therefore, the clip will vary only 3 lbf against a 0.030" tolerance variation. These mechanical characteristics can be adjusted by a number of methods, including material removal (e.g. removing material from the spring member to alter the effective section modulus), and/or varying the spring arc length, width, thickness, and material type of the spring.

Secondly, the two-piece clip design of FIG. 1 or the single-piece clip design of FIGS. 2 and 3 allow for a level of independence between the retention and spring members. For example, if a different leg configuration is required to accommodate insertion into a different configuration of heat sink holes 21 and/or circuit board holes 17, the retention member 12 can be redesigned and replaced without affecting the spring member 14. Alternatively, if a higher or lower spring force is desired, the spring member 14 can be redesigned and replaced without affecting the design of the retention member. Also, once the components are assembled in a stacked configuration and secured to clip 10 as described above, the components (heat sink and circuit board) can be easily separated from the clip with the use of a flat tool (e.g. screwdriver) to separate upper barbs 24 from the heat sink without the need for separating the clip components (spring member 14 and retention member 12) from each other.

While there have been shown and described and pointed out fundamental novel features of the present invention as applied to a preferred embodiment thereof, it will be understood that various omissions and substitutions and changes in the methods described and in the form and details of the devices illustrated, and in their operation, may be made by those skilled in the art without departing from the spirit of the present invention. For example, it is expressly intended that all combinations of those elements which perform substantially the same function in substantially the same way to achieve the same results are within the scope of the invention. Substitutions of elements from one described embodiment to another are also fully intended and contemplated. It is also to be understood that the drawings are not necessarily drawn to scale but that they are merely conceptual in nature. It is the intention, therefore, to be limited only as indicated by the scope of the claims appended hereto.

We claim:

1. A combination of a heat sink, a spring clip and a heat generating electrical component, comprising:

a heat generating electrical component mounted to a circuit board, said electrical component having an engaging region;

heat sink having an engaging region and a contact surface for contacting said electrical component engaging region for conducting heat from said electrical component to said heat sink; and a spring clip securing said heat sink to said circuit board, said spring clip having a retention member having a base and a leg, said leg being releasably secured to said engaging region on the heat sink, a spring member engaged with said retention member and providing a spring force to the circuit board, and a securing member connected to said leg and releaseably coupling to said heat sink engaging region with said circuit board positioned on said spring member and said heat sink positioned on said electrical component so that said heat sink contact region is in contact with said electrical component whereby said heat generating electrical component is compressed between said heat sink and said spring member.

2. The combination of claim 1, wherein said leg comprises a plurality of legs and wherein said securing member comprises an upper barb positioned proximate a distal end of each of said legs.

3. The combination of claim 2, wherein said legs comprise a first pair of legs and a second pair of legs, wherein said retention member has a first outer edge and a second outer edge, wherein said first pair of legs is positioned at a distance relative to said first outer edge to define a first region therebetween, and wherein said second pair of legs is positioned at a distance relative to said second outer edge to define a second region between said second outer edge and said second pair of legs, said spring member engaging said retention member at said first and second regions.

4. The combination of claim 1, wherein said spring member is hingedly secured to said retention member.

5. The combination of claim 4, wherein said spring member is integrally formed with said retention member.

6. The combination of claim 2, wherein each of said upper barbs comprises an angled front face.

7. The combination of claim 2, wherein said retention member has a longitudinal axis and wherein said upper barbs are oriented in a parallel direction relative to said longitudinal axis.

8. The combination of claim 7, wherein said securing means further comprises a lower barb positioned on each said leg proximate a close end of each said leg for engaging said spring member and for releasably securing said spring member to said retention member.

9. The combination of claim 1, wherein said spring member comprises a plurality of spring members.

10. A spring clip for securing a heat sink to a heat generating electrical component mounted on a circuit board so that the heat generating electrical component is positioned between the heat sink and said spring clip to provide physical and thermal contact between the heat sink and the electrical component, comprising:

a retention member having a base and a plurality of legs, at least one of said legs having a retention barb proximate a respective distal end, said at least one leg being dimensioned for releasable securement to an engaging region on the heat sink, said plurality of legs defining an interior region on said retention member;

a spring member hingedly secured to said retention member for providing a spring force to the circuit board when the circuit board is positioned on said spring member, wherein said spring member engages said retention member within said interior region; and a securing member connected to said retention member and configured so as to be engageable with the heat sink so that the heat generating electrical component is compressible between the heat sink and the spring member.

11. The spring clip of claim 10, further comprising a barb proximate a distal end of each of said legs.

12. The spring clip of claim 11, wherein said retention member has a longitudinal axis and wherein said barbs are oriented in a direction perpendicular to said longitudinal axis.

13. The spring clip of claim 10, wherein said spring member comprises a plurality of spring members.

* * * * *

UNITED STATES PATENT AND TRADEMARK OFFICE
CERTIFICATE OF CORRECTION

PATENT NO. : 6,229,706 B1
DATED : May 8, 2001
INVENTOR(S) : Randolph H. Cook et al.

It is certified that error appears in the above-identified patent and that said Letters Patent is hereby corrected as shown below:

Title page,
Change the residence address of Mark Pelillo from "Caconia" to -- Laconia --.

Signed and Sealed this

Second Day of October, 2001

Attest:

NICHOLAS P. GODICI
*Attesting Officer*    *Acting Director of the United States Patent and Trademark Office*